(12) United States Patent
Miao et al.

(10) Patent No.: US 12,670,368 B2
(45) Date of Patent: Jun. 30, 2026

(54) TUNABLE HOMOJUNCTION FIELD EFFECT DEVICE-BASED ARTIFICIAL SYNAPSE CIRCUIT AND IMPLEMENTATION METHOD THEREOF

(71) Applicant: NANJING UNIVERSITY, Nanjing (CN)

(72) Inventors: Feng Miao, Nanjing (CN); Shijun Liang, Nanjing (CN); Chen Pan, Nanjing (CN); Chenyu Wang, Nanjing (CN); Pengfei Wang, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 836 days.

(21) Appl. No.: 17/924,712

(22) PCT Filed: Jul. 2, 2020

(86) PCT No.: PCT/CN2020/099816
§ 371 (c)(1),
(2) Date: Nov. 11, 2022

(87) PCT Pub. No.: WO2022/000394
PCT Pub. Date: Jan. 6, 2022

(65) Prior Publication Data
US 2023/0196084 A1 Jun. 22, 2023

(30) Foreign Application Priority Data
Jun. 28, 2020 (CN) .......................... 202010596185.2

(51) Int. Cl.
| | |
|---|---|
| *G06N 3/06* | (2006.01) |
| *H10D 30/69* | (2025.01) |
| *H10D 64/23* | (2025.01) |
| *H10D 64/27* | (2025.01) |

(52) U.S. Cl.
CPC ........... *G06N 3/061* (2013.01); *H10D 30/701* (2025.01); *H10D 64/251* (2025.01); *H10D 64/511* (2025.01)

(58) Field of Classification Search
CPC ..... G06N 3/061; H10D 64/251; H10D 64/511
See application file for complete search history.

(56) References Cited

U.S. PATENT DOCUMENTS

| | | | |
|---|---|---|---|
| 2017/0084648 A1* | 3/2017 | Liu ........................ | H10F 39/802 |
| 2023/0155010 A1* | 5/2023 | Bois ..................... | H10D 62/137 |
| | | | 257/565 |

* cited by examiner

*Primary Examiner* — Steven M Page
(74) *Attorney, Agent, or Firm* — CBM PATENT CONSULTING, LLC

(57) ABSTRACT

A tunable homojunction field effect device-based artificial synapse circuit includes a first tunable homojunction field effect device M1, a second tunable homojunction field effect device M2, a third tunable homojunction field effect device M3, and a capacitor C; the tunable homojunction field effect device can exhibit the electrical properties of NN junction, PP junction, PN junction, and NP junction under the control of gate voltage; in the circuit, whether the device M2 and the device M3 are turned on rely on the combined action of presynaptic pulse and postsynaptic pulse; compared with the circuit structure of a traditional CMOS circuit scheme which exhibits neural synaptic functions of spike-time-dependent plasticity and continuously adjustable pulse-to-synaptic weight, the circuit in the present solution requires a greatly reduced number of devices and shows the feature of reconfigurable function, exhibiting a great advantage in constructing low-power, high-density integrated bionic chips for future neuromorphic applications.

9 Claims, 7 Drawing Sheets

| Implementation scheme of multi-functional operations of tunable homojunction field effect device | | | | | | |
|---|---|---|---|---|---|---|
| $V_{ds}$ | $V_{gA}$ | $V_{gB}$ | Channel homo junction state | Current state | Device function | |
| >0 | >0 | >0 | NN junction | on | N-type FET | FET |
| | | <0 | NP junction | off | | |
| <0 | <0 | <0 | PP junction | on | P-type FET | |
| | | >0 | PN junction | off | | |
| >0 | <0 | >0 | PN junction | on | forward diode | unidirectional diode |
| <0 | | | PN junction | off | | |
| <0 | >0 | <0 | NP junction | on | reverse diode | |
| >0 | | | NP junction | off | | |

FIG. 4

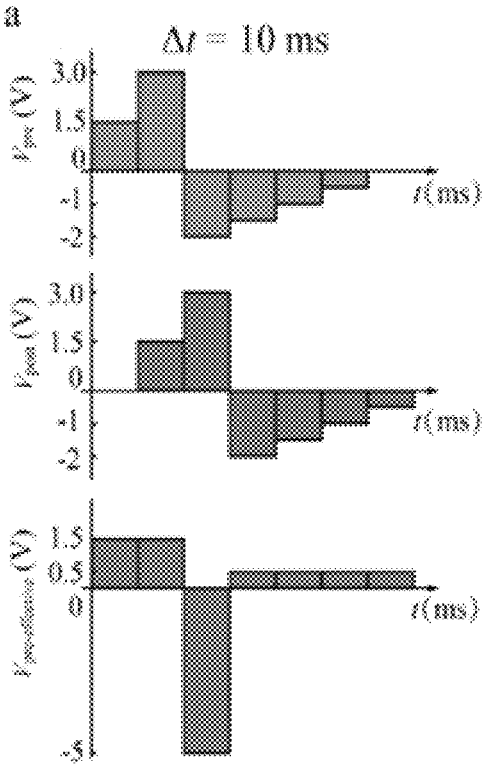
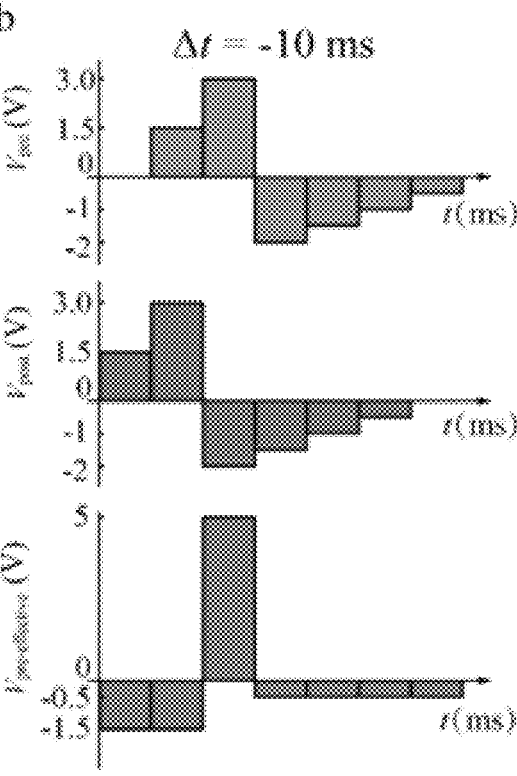
FIG. 7A                    FIG. 7B

TUNABLE HOMOJUNCTION FIELD EFFECT DEVICE-BASED ARTIFICIAL SYNAPSE CIRCUIT AND IMPLEMENTATION METHOD THEREOF

TECHNICAL FIELD

The present invention relates to the technical field of neuromorphic engineering, and particularly to a tunable homojunction field effect device-based artificial synapse circuit and an implementation method thereof.

BACKGROUND

With the development of emerging electronic application scenarios such as pattern recognition, autonomous driving, artificial intelligence, etc., neuromorphic computing has exhibited a further enhanced application value. However, traditional silicon-based complementary metal-oxide-semiconductor (CMOS) devices possess single electrical properties which significantly differ from rich plasticity dynamical characteristics of biological nervous systems. Therefore, neuromorphic circuits constructed with traditional metal oxide semiconductor (MOS) devices need to consume a lot of transistor resources. For example, constructing a synapse circuit requires more than 10 transistors, which leads to an excessively high power consumption and a relatively large area and cannot meet the application of low-power neuromorphic computing in the future.

SUMMARY

Objective of the present invention: To overcome the deficiencies of the prior art, the present invention provides a tunable homojunction field effect device-based artificial synapse circuit, which solves the problems of high power consumption and large area caused by too many devices required for a synapse circuit. The present invention further provides a method for implementing a function of an artificial synapse circuit.

Technical solution: On one aspect, the present invention provides a tunable homojunction field effect device-based artificial synapse circuit, which includes a first tunable homojunction field effect device M1, a second tunable homojunction field effect device M2, a third tunable homojunction field effect device M3, and a capacitor C.

The source S2 of M2 is connected to the gate electrode G3A of M3 close to the source and used to input a presynaptic pulse. The source S3 of M3 is connected to the gate electrode G2A of M2 close to the source and used to input a postsynaptic pulse. The drain D2 of M2 is connected to the gate electrode G2B close to the drain D2 and the gate electrode G1A of M1 close to the source S1. The drain D3 of M3 is connected to the gate electrode G3B close to the drain D3 and the gate electrode G1B of M1 close to the drain D1.

The capacitor C is connected between the two gate electrodes G1A and G1B of M1, which achieves the charging/discharging operation via the current flowing through the transistors M2 and M3. The relative potential across the capacitor C determines the homojunction state of M1. The source S1 and the drain D1 of M1 are respectively used to apply the source bias voltage $V_1$ and the drain bias voltage $V_2$.

The structures of M1, M2, and M3 are the same, each including a substrate insulating material, a channel material layer, an insulating layer, and a metal electrode layer. The metal electrode layer includes a drain electrode layer, a source electrode layer, a gate electrode layer A, and a gate electrode layer B. The gate electrode layer A and the gate electrode layer B are fabricated side by side on the substrate insulating material, and a gap is left between the gate electrode layer A and the gate electrode layer B to ensure electrical insulation therebetween. The insulating layer completely covers the gate electrode layer A and the gate electrode layer B. The drain electrode layer is placed on the left edge of the channel material layer above the gate electrode layer A, and the source electrode layer is placed on the right edge of the channel material layer above the gate electrode layer B. That is, the gate electrode layer A corresponds to the gate electrode G1B in M1, the gate electrode G2B in M2, and the gate electrode G3B in M3, and the gate electrode layer B corresponds to the gate electrode G1A in M1, the gate electrode G2A in M2, and the gate electrode G3A in M3.

Further, including:

The channel material layer uses a material with ambipolar field effect characteristics which is a low-dimensional semiconductor material.

Further, including:

The low-dimensional semiconductor material is silicon nanowires, carbon nanotubes, two-dimensional layered materials, or organic semiconductor thin film materials.

Further, including:

The material with ambipolar field effect characteristics is an intrinsic semiconductor with a band gap ranging from 0.5 eV to 1.5 eV and a material thickness of less than 30 nm.

Further, including:

The homojunction state includes electrical properties of NN junction, PP junction, PN junction, and NP junction.

On another aspect, the present invention further provides a method for implementing a circuit function of a tunable homojunction field effect device-based artificial synapse circuit, including:

applying bias voltages $V_1$ and $V_2$ to the source S1 and the drain D1 of M1, $V_1 < V_2$, and measuring the current value $I_{ds-M1-before}$ passing through M1 at this moment;

applying a presynaptic pulse and a postsynaptic pulse, recording the time difference $\Delta t$ between a presynaptic pulse voltage and a postsynaptic pulse voltage, and charging the capacitor C;

measuring the current value $I_{ds-M1-after}$ passing through M1 after applying the presynaptic pulse and the postsynaptic pulse, and calculating the synaptic weight change $\Delta W$;

changing the presynaptic pulse and the postsynaptic pulse with the bias voltages $V_1$ and $V_2$ remaining unchanged to determine the change rule between $\Delta W$ and $\Delta t$, and simulating the biological anti-Hebbian learning rule.

Further, including:

The rule that $\Delta W$ changes with the change of $\Delta t$ includes:

When $\Delta t > 0$, a net negative-going effective pulse is generated, reducing the electrical conductivity of M1, namely, reducing the strength of a synaptic connection, otherwise, When $\Delta t < 0$, a net positive-going effective pulse is generated, enhancing the electrical conductivity of M1, namely, enhancing the strength of a synaptic connection, and when $|\Delta A|$ increases, the absolute value of the net effective pulse will decrease, that is, the absolute value of the synaptic weight change $|\Delta W|$ decreases.

Further, including:

The method also includes:

exchanging the values of the bias voltages $V_1$ and $V_2$ and keeping unchanged and changing the presynaptic pulse and the postsynaptic pulse to determine the change rule between $\Delta W$ and $\Delta t$ and then simulate the biological Hebbian learning rule.

Further, including:

When $\Delta t > 0$, a net positive-going effective pulse is generated, enhancing the electrical conductivity of M1, namely, enhancing the strength of a synaptic connection, otherwise, When $\Delta t < 0$, a net negative-going effective pulse is generated, reducing the electrical conductivity of M1, namely, reducing the strength of a synaptic connection.

Beneficial effect: The circuit of the present invention is only composed of three tunable homojunction field effect devices based on ambipolar field effect characteristic materials and a standard capacitive element and can functionally simulate the spike-time-dependent plasticity of neural synapses. Compared with a CMOS circuit which achieves similar functions and requires more than ten devices, the present solution has the advantage of involving simple circuit structure. Furthermore, with this circuit structure as a basic circuit unit, complex neuromimetic biological information processing functions can be realized by cascading.

BRIEF DESCRIPTION OF THE DRAWINGS

FIG. 4 is a device function table of the tunable homojunction field effect device of Embodiment 1 under different electrical operations;

FIG. 7A is a schematic diagram of the actual effective pulse generated on the circuit under the combined action of the presynaptic pulse and the postsynaptic pulse input in Embodiment 1: a schematic diagram of the actual effective pulse generated on the circuit under the combined action of the presynaptic pulse and the postsynaptic pulse when $\Delta t > 0$;

FIG. 7B is a schematic diagram of the actual effective pulse generated on the circuit under the combined action of the presynaptic pulse and the postsynaptic pulse input in Embodiment 1: a schematic diagram of the actual effective pulse generated on the circuit under the combined action of the presynaptic pulse and the postsynaptic pulse when $\Delta t < 0$;

DETAILED DESCRIPTION OF THE DRAWINGS

Embodiment 1

Figure 1:
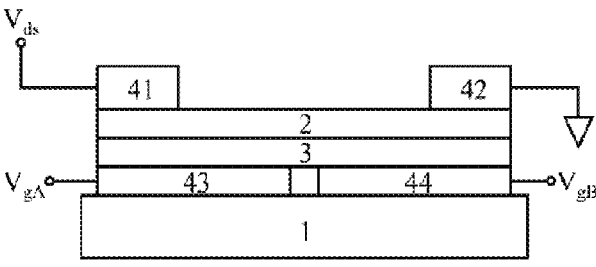
FIG. 1 is a schematic diagram of the tunable homojunction field effect device of Embodiment 1.
Figure 2:
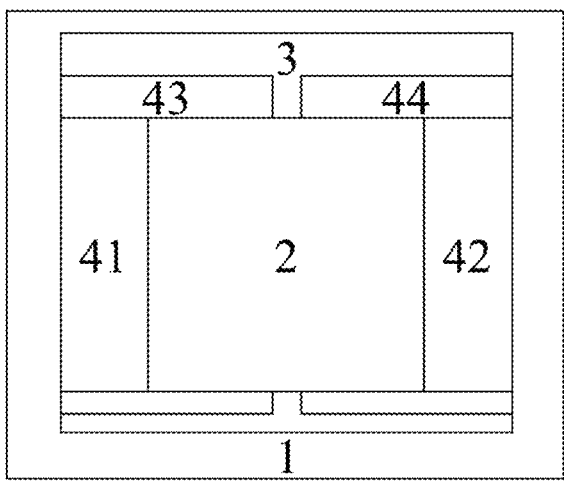
FIG. 2 is a top view of the tunable homojunction field effect device of Embodiment 1.
Figure 3:
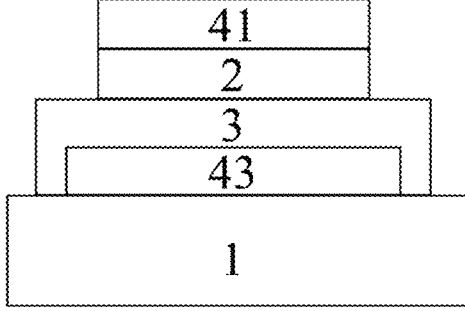
FIG. 3 is a right view of the tunable homojunction field effect device of Embodiment 1.

As shown in FIG. 1, FIG. 2, and FIG. 3, the present invention first introduces a tunable homojunction-based field effect device, which includes an insulating layer 3, a metal electrode layer, a channel material layer 2, and a substrate insulating material 1. The metal electrode layer includes a drain electrode layer 41, a source electrode layer 42, a gate electrode layer A43, and a gate electrode layer B44.

The gate electrode layer A43 and the gate electrode layer B44 are fabricated side by side on the substrate insulating material 1, and a gap is left therebetween to ensure that the gate electrode layer A43 and the gate electrode layer B44 are non-conducting. The insulating layer 3 is laid on the gate electrode layer A43 and the gate electrode layer B44. The channel material layer 2 is laid on overlapping areas between the gate electrode layer A43 and the insulating layer 3 and between the gate electrode layer B44 and the insulating layer 3, so that the channel material layer 2 is completely isolated from the gate electrode layer A43 and the gate electrode layer B44 by the insulating layer 3, respectively. The drain electrode layer 41 and the source electrode layer 42 are fabricated directly above the channel material layer 2 and placed directly above the left edges and the right edges of the gate electrode layer A43 and the gate electrode layer B44, respectively, while ensuring that the drain electrode layer 41 and the source electrode layer 42 are completely isolated from the gate electrode layer A43 and the gate electrode layer B44 by the insulating layer 3.

In the present embodiment, the channel material layer 2 is an intrinsic semiconductor with a band gap ranging from 0.5 eV to 1.5 eV and a material thickness of less than 30 nm, which can exhibit ambipolar field effect characteristics. The channel material layer 2 can be selected from low-dimensional semiconductor materials such as silicon nanowires, carbon nanotubes, two-dimensional layered materials, or organic semiconductor thin film materials. The metal work function of the drain electrode layer 41 and the source electrode layer 42 is the middle energy value of the band gap of the channel material layer.

In the present embodiment, the gate insulating layer can be selected from insulating material layers such as a silicon dioxide layer, an aluminum oxide layer, a hafnium oxide layer, a hexagonal boron nitride layer, and a zirconium oxide layer.

As shown in FIG. 1, the drain electrode layer 41 is applied with the bias voltage $V_{ds}$, the source electrode layer 42 is grounded, the gate electrode layer A43 is applied with the gate voltage $V_{gA}$, and the gate electrode layer B44 is applied with the gate voltage $V_{gB}$.

In the present embodiment, the channel material layer of the device can be regulated to be an NN-type homojunction, a PP-type homojunction, a PN-type homojunction, and an NP-type homojunction under gate voltage bias. Under the operation of source-drain voltages ($V_{ds}$) of different polarities, the forward bias or reverse bias state of the homojunction is further realized to determine whether the current state of the device is on or off. The specific regulation method is as follows:

As shown in FIG. 4, in the present embodiment, when $V_{ds} > 0$ and $V_{gA} > 0$, the device scans $V_{gB}$ to realize the function of N-type field effect transistor (FET) device. When $V_{gB} > 0$, the channel homojunction state is an NN junction, and the current state is on. When $V_{gB} < 0$, the channel homojunction state is a forward-biased NP junction, and the current state is off.

In the present embodiment, when $V_{ds} < 0$ and $V_{gA} < 0$, the device scans $V_{gB}$ to realize the function of P-type FET device. When $V_{gB} > 0$, the channel homojunction state is a reverse-biased PN junction, and the current state is off.

When $V_{gB}<0$, the channel homojunction state is a PP junction, and the current state is on.

In the present embodiment, under the combined operation of $V_{gA}<0$ and $V_{gB}>0$, the channel homojunction state of the device is regulated as a PN junction, and the device scans $V_{ds}$ to realize the function of a forward diode device and acts as a forward diode. When $V_{ds}>0$, the channel homojunction state is a forward-biased PN junction, and the current state is on. When $V_{ds}<0$, the channel homojunction state is a reverse-biased PN junction, and the current state is off.

In the present embodiment, under the combined operation of $V_{gA}>0$ and $V_{gB}<0$, the channel homojunction state of the device is regulated as an NP junction, exhibiting a reverse diode, and the device scans $V_{ds}$ to realize the function of a forward diode device. When $V_{ds}>0$, the channel homojunction state is a forward-biased NP junction, and the current state is off. When $V_{ds}<0$, the channel homojunction state is a reverse-biased NP junction, and the current state is on.

Thus, a single device can achieve device functions of N-type FET, P-type FET, forward diode, and reverse diode under different electrical operations.

Based on the electrical reconfigurability of the novel tunable homojunction field effect device described above, the present invention provides a design scheme that can greatly simplify the traditional CMOS artificial neural synapse circuit. The two fundamental neural synaptic functions achieved include: reconfigurable spike-time-dependent plasticity and continuously adjustable pulse-to-synaptic weight. The circuit structure using the traditional CMOS circuit scheme to demonstrate these two fundamental neural synaptic functions requires at least ten devices and one standard capacitive element, while the circuit in the present solution only needs three devices and one standard capacitive element. Therefore, the present solution provides a technical route for realizing the miniaturization of a high-performance brain-like chip. Moreover, the circuit in the present solution exhibits the feature of functional reconfiguration, which provides a reliable basis for further expanding the plasticity of a neuromorphic chip. Specifically, the circuit includes:

The presynaptic pulse is input to the source S2 of the device M2 and the gate electrode G3A of the device M3, and the postsynaptic pulse is input to the source S3 of the device M3 and the gate electrode G2A close to the source of the device M2. The capacitor C is connected between the two gate electrodes G1A and G1B of M1, and the charging and discharging process of the capacitor C is dominated by the current flowing through the device M2 and the device M3. The relative potential across the capacitor C determines the homojunction state of the device M1, namely, NN junction, PN junction, PP junction, and NP junction. The relative potential of the bias voltage $V_1$ and the bias voltage $V_2$ determines the source-drain voltage bias state of the device M1, which further affects the current flowing through the device M1. This current is the pseudo-postsynaptic current, and its magnitude reflects the magnitude of the synaptic connection weight W.

Figure 6:
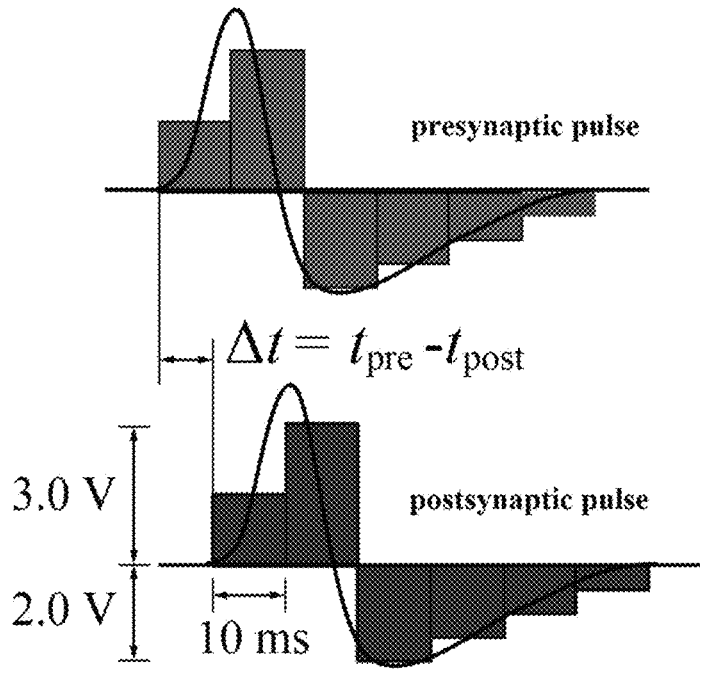
FIG. 6 shows waveforms of the presynaptic pulse and the postsynaptic pulse input in Embodiment 1.

In the present embodiment, the specific implemented waveforms of the presynaptic pulse and the postsynaptic pulse are shown in FIG. 6, which are respectively composed of six groups of square waves. The highest positive voltage is 3.0 V, and the lowest negative voltage is −2.0 V. The time of each square wave is 10 ms. The combined pulse simulates the real voltage pulse signal in a biological system, and the curves in FIG. 6 represent the real pulse signals. As shown in FIG. 6 and FIG. 7, the time difference $\Delta t$ between the presynaptic pulse voltage $V_{pre}$ and the postsynaptic pulse voltage $V_{post}$ induces an effective presynaptic pulse voltage $V_{pre\text{-}effective}$, that is, $V_{pre\text{-}effective}=V_{pre}-V_{post}$, $\Delta t=t_{pre}-t_{post}$, $t_{pre}$ is the start time of the presynaptic pulse voltage, and $t_{post}$ is the start time of the postsynaptic pulse voltage. When $\Delta t>0$, the generated effective presynaptic pulse voltage is a relatively large negative value, and the third figure in FIG. 7A shows the waveform corresponding to $V_{pre\text{-}effective}$. When $\Delta t<0$, the generated effective presynaptic pulse voltage is a relatively large positive value, and the third figure in FIG. 7B shows the waveform corresponding to $V_{pre\text{-}effective}$.

Figure 5:
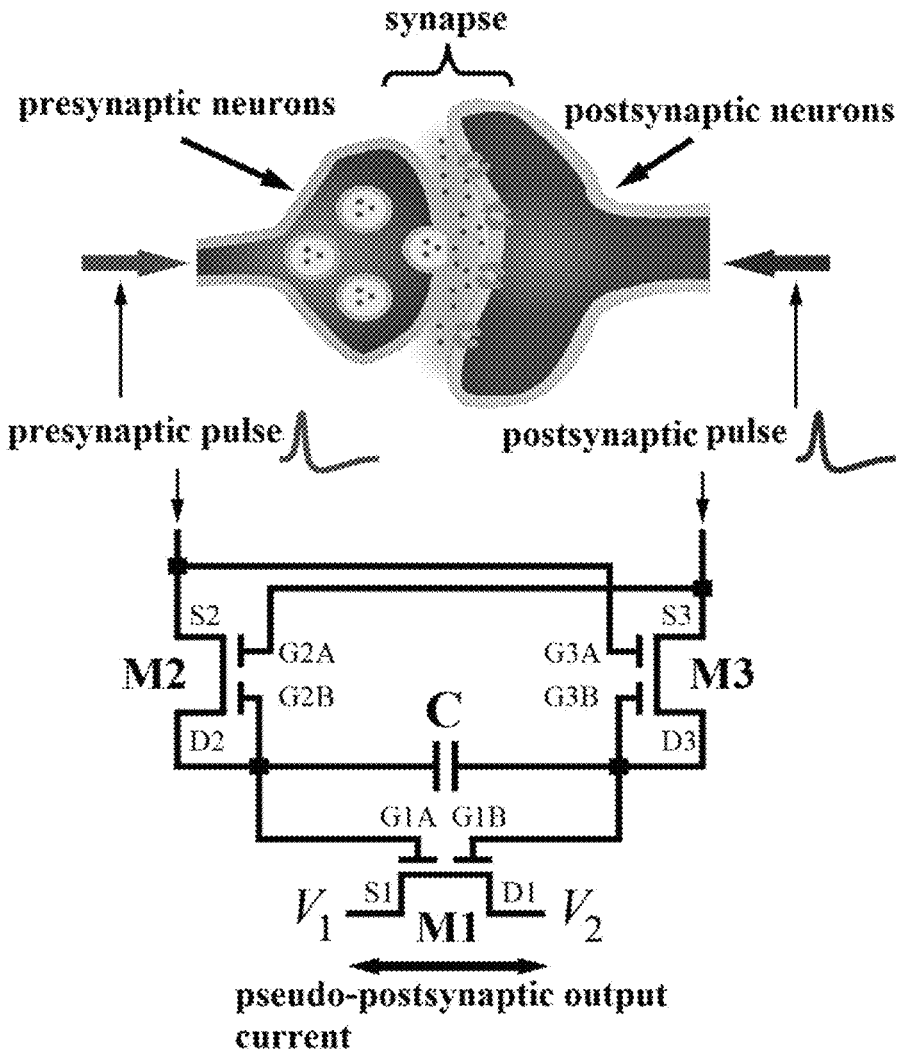
FIG. 5 shows the circuit structure described in Embodiment 1 and the corresponding relationship between the circuit structure and biological neural synaptic functions.

In the present embodiment, the device M1 receives the presynaptic pulse signal and the postsynaptic pulse signal from the device M2 and the device M3, respectively. The working mechanism of the circuit is as follows:

When the output pulse signal is applied to the devices M2 and M3 and makes them into a turn-on state, the capacitor C is thereby induced to be charged. When the pulse signal passes, under the influence of the feedback of the voltage across the capacitor C, the devices M2 and M3 become a turn-off state. As shown in FIG. 5, the drain D2 of the device M2 is connected to the gate G2B of the device M2, and the drain D3 of the device M3 is connected to the gate G3B of M3, thereby suppressing the discharging process of the capacitor C. Since there is a relatively stable potential difference across the capacitor C, a potential difference is generated between the two gate electrodes of the device M1, thereby inducing the channel of the device M1 to form a PN junction or an NP junction.

Further, bias voltages $V_1$ and $V_2$ are applied to the source and the drain of the device M1, and the relative difference between $V_1$ and $V_2$ determines the source-drain bias state of the device M1, thereby determining the magnitude of the current flowing through the device M1, that is, the magnitude of the postsynaptic current. Therefore, under the action of the presynaptic pulse signal and the postsynaptic pulse signal, an adjustable postsynaptic current is generated.

Further, since the channel region of the device M1 behaves as a PN junction or an NP junction, the device M1 shows an opposite current conducting state in response to the source-drain bias state of opposite polarity, which stems from the fact that the PN junction or the NP junction has the characteristic of diode rectification. Therefore, the spike-time-dependent plasticity exhibited by the circuit enables reconfigurable Hebbian and anti-Hebbian learning rules by controlling the relative potential of $V_1$ and $V_2$, as shown in FIGS. 8B and 8A.

In the present embodiment, the bias voltages $V_1$ and $V_2$ are adjusted to simulate the Hebbian and anti-Hebbian learning rules of synapse. The determination of the synaptic weight change is as follows: under the given bias voltages $V_1$ and $V_2$, the current value $I_{ds\text{-}M1\text{-}before}$ of the device M1 before the application of the presynaptic pulse and the postsynaptic pulse is measured, and at this moment, the synaptic weight is determined as $W_{before}$. Subsequently, the current value $I_{ds\text{-}M1\text{-}after}$ of the device M1 after the application of the presynaptic pulse and the postsynaptic pulse is measured, and at this moment, the synaptic weight is determined as $W_{after}$. The synaptic weight change $\Delta W$ is obtained according to the formula $\Delta W=(W_{after}-W_{before})/W_{before}=(I_{ds\text{-}M1\text{-}after}-I_{ds\text{-}M1\text{-}before})/I_{ds\text{-}M1\text{-}before}$.

Figures 8A, 8B:
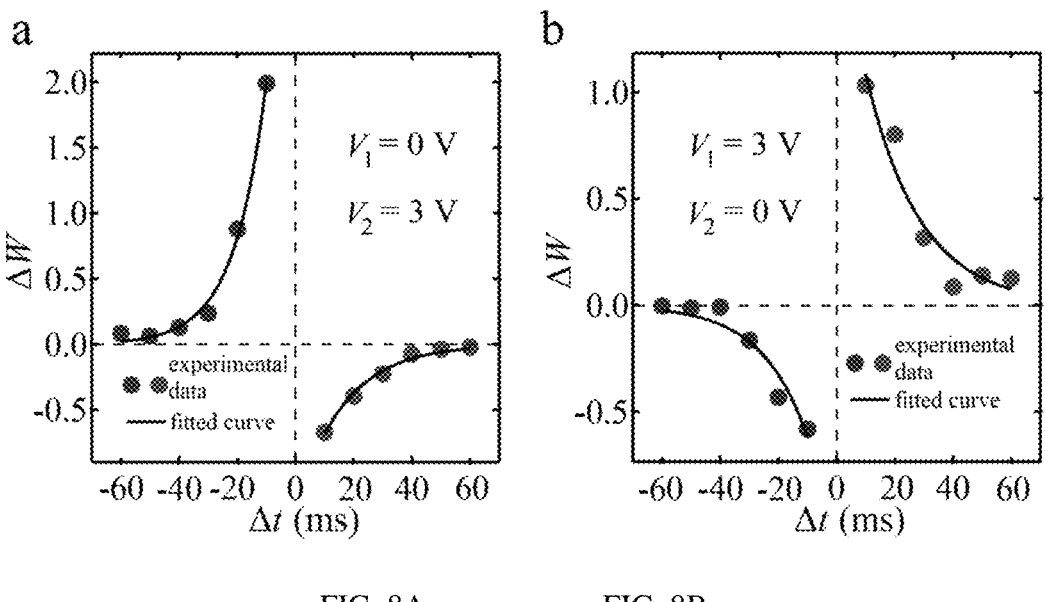
FIG. 8A shows the measured spike-time-dependent plasticity of the reconfigurable biomimetic nervous system synapse of Embodiment 1: a schematic diagram obtained by simulating the biological anti-Hebbian learning rule.
FIG. 8B shows the measured spike-time-dependent plasticity of the reconfigurable biomimetic nervous system synapse of Embodiment 1: a schematic diagram obtained by simulating the biological Hebbian learning rule

In the present embodiment, FIG. 8A shows the change rule of the synaptic weight change $\Delta W$ with the time difference $\Delta t$ between the presynaptic pulse and the postsynaptic pulse when $V_1=0$ V and $V_2=3$ V. Specifically:

When $\Delta t>0$, a net negative-going effective pulse is generated, reducing the electrical conductivity of M1, namely, reducing the strength of a synaptic connection;

When Δt<0, a net positive-going effective pulse is generated, enhancing the electrical conductivity of M1, thereby increasing the strength of a synaptic connection. When |Δt| increases, the absolute value of the net effective pulse will decrease, resulting in a reduction of the absolute value of the synaptic weight change |ΔW|. In the experiment, when |Δt| is greater than 50 ms, the synaptic weight is not likely to change significantly, as shown in FIG. 8A. Therefore, 50 ms is the threshold of this experiment. However, it should be noted that with the change in the input waveform time and voltage, the threshold of 50 ms also varies. The behavior of ΔW and Δt represents the biological anti-Hebbian learning rule.

Based on the same circuit structure, by changing the bias voltages $V_1$ and $V_2$ to $V_1=3$ V and $V_2=0$ V, the Hebbian learning rule can also be simulated. As shown in FIG. 8b, when Δt>0, a net positive-going effective pulse is generated, which enhances the electrical conductivity of M1, namely, enhancing the strength of a synaptic connection, otherwise, when Δt<0, a net negative-going effective pulse is generated, which reduces the electrical conductivity of M1, namely, reducing the strength of a synaptic connection. In FIG. 8, the dots represent the test data, and the solid lines represent curve fitting based on the mathematical model of biological spike-time-dependent plasticity, which proves that the experimental results of the present invention simulate the spike-time-dependent plasticity rule in biology very well.

Embodiment 2

Figure 9:
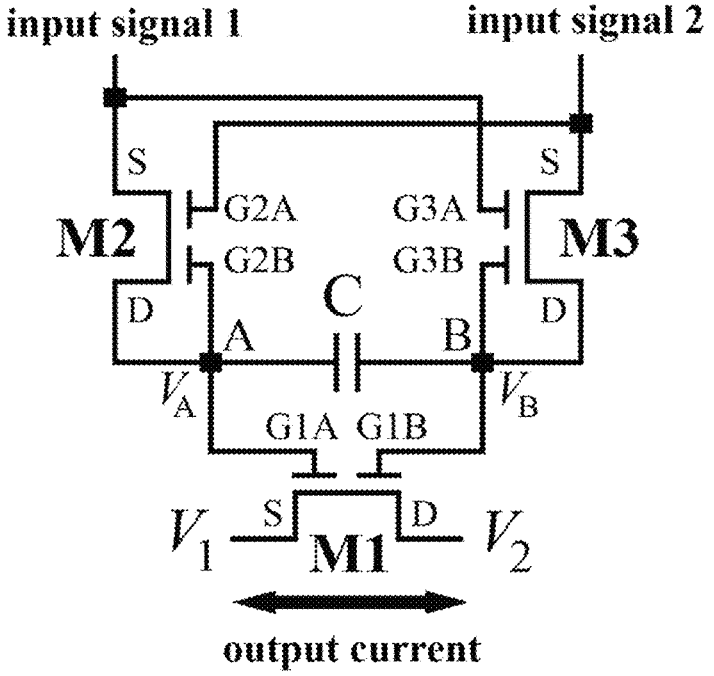
FIG. 9 shows schematic diagrams of the circuit structure and the voltage operation of Embodiment 2.

As shown in FIG. 9, the present embodiment is based on a circuit structure the same as that of Embodiment 1 and subjected to the following electrical operations: the input pulse signal is applied to the source S2 of the device M2 and the gate electrode G3A of the device M3, while the source S3 of the device M3 and the gate electrode G2A of the device M2 are given a resting potential, that is, $V_{rest}=0$ V.

Figure 10:
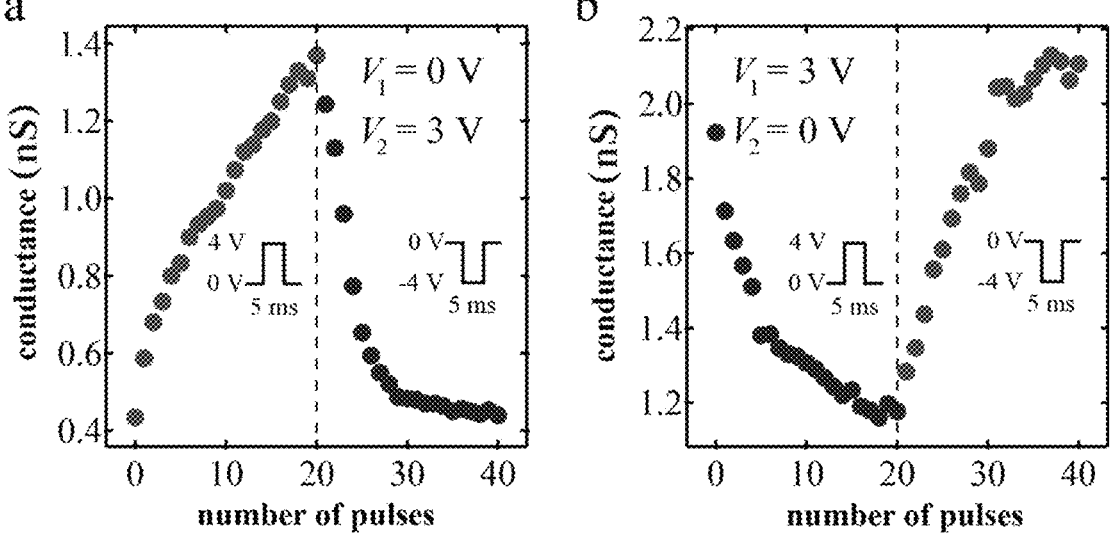
FIG. 10 shows the measured continuously adjustable weight of the reconfigurable pseudo-synapse of Embodiment 2.

In the present embodiment, when a positive pulse is applied, the devices M2 and M3 are turned on, and the capacitor C is charged, so that the potential of point A is higher than the potential of point B, that is, $V_A>V_B$. When the pulse application stops, the devices M2 and M3 are turned off, and the discharging process of the capacitor C is suppressed. Therefore, a relatively stable potential difference is generated across the device M1. Similar to the operations in Embodiment 1, changing the bias voltages $V_1$ and $V_2$ can achieve two different rules of change in the synaptic weight with continuous pulses. When a negative pulse is applied, the devices M2 and M3 are turned on, and the capacitor C begins to discharge. Then, the potential of point A gradually decreases until being equal to the potential of point B. When the pulse application stops, the devices M2 and M3 are turned off, suppressing the further discharging of the capacitor C, so that a relatively stable potential difference is generated between the two discrete gate electrodes of the device M1. FIGS. 10a and 10b show the two different rules of change in the synaptic weight with continuous pulses by changing the bias voltages $V_1$ and $V_2$, where, the abscissa in the figure is the number of pulses, and the ordinate is the conductance value of the device M1.

What is claimed is:

1. A tunable homojunction field effect device-based artificial synapse circuit, wherein the circuit comprises a first tunable homojunction field effect device M1, a second tunable homojunction field effect device M2, a third tunable homojunction field effect device M3, and a capacitor C;

the source S2 of M2 is connected to the gate electrode G3A of M3 close to the source, which serves as a first input terminal and is used to input a presynaptic pulse, the source S3 of M3 is connected to the gate electrode G2A of M2 close to the source, which serves as a second input terminal and is used to input a postsynaptic pulse; the drain D2 of M2 is connected to the gate electrode G2B close to the drain D2 and the gate electrode G1A of M1 close to the source S1, the drain D3 of M3 is connected to the gate electrode G3B close to the drain D3 and the gate electrode G1B of M1 close to the drain D1; the capacitor C is connected between the two gate electrodes G1A and G1B of M1, the source S1 and the drain D1 of M1 are respectively used to apply the source bias voltage $V_1$ and the drain bias voltage $V_2$;

the structures of M1, M2, and M3 are the same, each comprising a substrate insulating material, a channel material layer, an insulating layer, and a metal electrode layer, the metal electrode layer comprises a drain electrode layer, a source electrode layer, a gate electrode layer A, and a gate electrode layer B, the gate electrode layer A and the gate electrode layer B are fabricated side by side on the substrate insulating material, and a gap is left between the gate electrode layer A and the gate electrode layer B to ensure electrical insulation therebetween, the insulating layer completely covers the gate electrode layer A and the gate electrode layer B, the drain electrode layer is placed on the left edge of the channel material layer above the gate electrode layer A, and the source electrode layer is placed on the right edge of the channel material layer above the gate electrode layer B, that is, the gate electrode layer A corresponds to the gate electrode G1B in M1, the gate electrode G2B in M2, and the gate electrode G3B in M3, and the gate electrode layer B corresponds to the gate electrode G1A in M1, the gate electrode G2A in M2, and the gate electrode G3A in M3.

2. The tunable homojunction field effect device-based artificial synapse circuit according to claim 1, wherein the channel material layer uses a low-dimensional semiconductor material with ambipolar field effect characteristics.

3. The tunable homojunction field effect device-based artificial synapse circuit according to claim 2, wherein the low-dimensional semiconductor material is silicon nanowires, carbon nanotubes, two-dimensional layered materials, or organic semiconductor thin film materials.

4. The tunable homojunction field effect device-based artificial synapse circuit according to claim 2, wherein the material with ambipolar field effect characteristics is an intrinsic semiconductor with a band gap ranging from 0.5 eV to 1.5 eV and a material thickness of less than 30 nm.

5. The tunable homojunction field effect device-based artificial synapse circuit according to claim 1, wherein the homojunction state comprises an NN junction, a PP junction, a PN junction, and an NP junction.

6. A method for implementing a circuit function of the tunable homojunction field effect device-based artificial synapse circuit according to claim 1, comprising:

applying bias voltages $V_1$ and $V_2$ to the source S1 and the drain D1 of M1, $V_1<V_2$, and measuring the current value $I_{ds-M1-before}$ passing through M1 at this moment;

applying a presynaptic pulse and a postsynaptic pulse, recording the time difference Δt between a presynaptic pulse voltage and a postsynaptic pulse voltage;

measuring the current value $I_{ds-M1-after}$ passing through M1 after applying the presynaptic pulse and the post-synaptic pulse, and calculating the synaptic weight change $\Delta W$;

changing the time difference between the presynaptic pulse and the postsynaptic pulse input with the bias voltages V1 and V2 remaining unchanged to determine the change rule between $\Delta W$ and $\Delta t$, and simulating the biological anti-Hebbian learning rule.

7. The method for implementing the circuit function of the tunable homojunction field effect device-based artificial synapse circuit according to claim 6, wherein the change rule between $\Delta W$ and $\Delta t$ comprises:

when $\Delta t>0$, generating a net negative-going effective pulse, reducing the electrical conductivity of M1, namely, reducing the strength of a synaptic connection, otherwise, when $\Delta t<0$, generating a net positive-going effective pulse, enhancing the electrical conductivity of M1, namely, enhancing the strength of a synaptic connec-tion, and when $|\Delta t|$ increases, the absolute value of the net effective pulse will decrease, that is, the absolute value of the synaptic weight change $|\Delta W|$ decreases.

8. The method for implementing the circuit function of the tunable homojunction field effect device-based artificial synapse circuit according to claim 6, wherein the method further comprises:

exchanging the values of the bias voltages $V_1$ and $V_2$ and keeping unchanged and changing the presynaptic pulse and the postsynaptic pulse to determine the change rule between $\Delta W$ and $\Delta t$ and then simulate the biological Hebbian learning rule.

9. The method for implementing the circuit function of the tunable homojunction field effect device-based artificial synapse circuit according to claim 8, wherein when $\Delta t>0$, a net positive-going effective pulse is generated, enhancing the electrical conductivity of M1, namely, enhancing the strength of a synaptic connection, otherwise, when $\Delta t<0$, a net negative-going effective pulse is gen-erated, reducing the electrical conductivity of M1, namely, reducing the strength of a synaptic connection.

* * * * *